United States Patent
Chen et al.

(10) Patent No.: US 12,255,650 B2
(45) Date of Patent: Mar. 18, 2025

(54) OPERATIONAL AMPLIFIER-BASED HYSTERESIS COMPARATOR AND CHIP

(71) Applicant: SHENZHEN GOODIX TECHNOLOGY CO., LTD., Shenzhen (CN)

(72) Inventors: Yutian Chen, Shenzhen (CN); Lvfan Yi, Shenzhen (CN)

(73) Assignee: SHENZHEN GOODIX TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 18/324,661

(22) Filed: May 26, 2023

(65) Prior Publication Data

US 2024/0088874 A1    Mar. 14, 2024

(30) Foreign Application Priority Data

Sep. 9, 2022   (CN) .......................... 202211099992.9

(51) Int. Cl.
*H03K 3/02* (2006.01)
*G01R 19/165* (2006.01)
(Continued)

(52) U.S. Cl.
CPC ... *H03K 3/02337* (2013.01); *G01R 19/16504* (2013.01); *G01R 19/16566* (2013.01);
(Continued)

(58) Field of Classification Search
CPC ........ H03K 3/02; H03K 3/023; H03K 3/0233; H03K 3/02337; H03K 3/353; H03K 3/356;
(Continued)

(56) References Cited

U.S. PATENT DOCUMENTS 7,292,083 B1 * 11/2007 Wang .................... H03K 5/2472
                                                        327/66
8,203,370 B2 * 6/2012 Yan ...................... H03K 3/3565
                                                        327/205
(Continued)

FOREIGN PATENT DOCUMENTS

CN    101013884 A    8/2007
CN    104038186 A    9/2014
(Continued)

OTHER PUBLICATIONS

Jichao Huang, Research on the Driving Method for Significant Hysteresis Reduction of Piezoelectric Stack Actuators, Master's e-journal, Engineering Science II, Issue 02,2021, Feb. 15, 2021.
(Continued)

*Primary Examiner* — Long Nguyen
(74) *Attorney, Agent, or Firm* — Emerson, Thomson & Bennett, LLC; Roger D. Emerson; Seth J. Niemi

(57) ABSTRACT

An operational amplifier-based hysteresis comparator and a chip are provided. The hysteresis comparator includes: an input stage and an amplification stage. The input stage includes: a first input branch and a second input branch, where the first input branch generates a first current based on the first voltage, and the second input branch generates a second current based on the second voltage. The first current is connected with a first input terminal of the amplification stage, and the second current is connected with a second input terminal of the amplification stage. An output terminal of the amplification stage outputs a first level when the first current is greater than the second current, and outputs a second level when the first current is less than the second current. The present disclosure changes the hysteresis voltage generation mode, thereby reducing the instability caused by positive feedback.

19 Claims, 8 Drawing Sheets

(51) Int. Cl.
*H03F 1/34* (2006.01)
*H03F 3/45* (2006.01)
*H03K 3/0233* (2006.01)
*H03K 5/22* (2006.01)
*H03K 5/24* (2006.01)

(52) U.S. Cl.
CPC ......... *H03F 1/342* (2013.01); *H03F 3/45264* (2013.01); *H03F 3/45273* (2013.01); *H03K 5/22* (2013.01); *H03K 5/2481* (2013.01)

(58) Field of Classification Search
CPC .......... H03K 3/3565; H03K 5/22; H03K 5/24; H03K 5/2472; H03K 5/2481; H03F 1/342; H03F 3/45264; H03F 3/45273; H03F 3/45183; H03F 2203/45656; G01R 19/165; G01R 19/16504; G01R 19/16566; G01R 19/16571; G01R 19/16576; G01R 19/0038
See application file for complete search history.

(56) References Cited

U.S. PATENT DOCUMENTS

2007/0241794 A1* 10/2007 Wang ................... H03K 5/2472
327/205
2020/0195241 A1 6/2020 Murphy et al.

FOREIGN PATENT DOCUMENTS

| CN | 104158516 A | 11/2014 |
| CN | 104953988 A | 9/2015 |
| CN | 110011647 A | 7/2019 |
| CN | 113196660 A | 7/2021 |
| CN | 114614801 A | 6/2022 |
| CN | 115001462 A | 9/2022 |
| JP | 2004064273 A | 2/2004 |
| JP | 2004194124 A | 7/2004 |
| JP | 2012156826 A | 8/2012 |
| JP | 2014147035 A | 8/2014 |
| TW | I717282 B | 1/2021 |
| WO | 106788354 A | 5/2017 |
| WO | 109510612 A | 3/2019 |

OTHER PUBLICATIONS

Shiqin Feng et al., Design of a hysteresis comparator with wide input range for CAN transceiver, Application of Electronic Technique, vol. 47(7), Jul. 31, 2021.
Mohsen Bazghaleh et al., Implementation and analysis of an innovative digital charge amplifier for hysteresis reduction piezoelectric stack actuators, Review of Scientific Instruments, vol. 85(4), Apr. 22, 2014.
Liansheng Zhang et al., Independent driving method for significant hysteresis reduction of piezoelectric stack actuators, Review of Scientific Instruments, vol. 90(11), Nov. 25, 2019.

* cited by examiner

OPERATIONAL AMPLIFIER-BASED HYSTERESIS COMPARATOR AND CHIP

CROSS REFERENCE TO RELATED APPLICATIONS

The present disclosure claims priority to Chinese Application No. 202211099992.9 filed on Sep. 9, 2022 and entitled "OPERATIONAL AMPLIFIER-BASED HYSTERESIS COMPARATOR AND CHIP", all of which is incorporated herein by reference in its entirety.

TECHNICAL FIELD

The present disclosure relates to the technical field of electronic circuits, and in particular to, an operational amplifier-based hysteresis comparator and a chip.

BACKGROUND

With an input voltage and a reference voltage in the form of analog signals as inputs, a general comparator outputs binary digital signals of high/low levels, and may be used as an interface circuit between an analog circuit and a digital circuit. However, noise of such a comparator near a threshold point has great influence. Because of introducing positive feedback, a hysteresis comparator will have a "hysteresis" characteristic at a threshold point. The hysteresis comparator generally has hysteresis near the threshold point, and a voltage range of hysteresis is referred to as a hysteresis window. Compared with the general comparator, the hysteresis comparator has a very strong anti-interference ability. However, the hysteresis comparator further has the problems of unstable circuit and overlarge layout area.

SUMMARY

Embodiments of the present disclosure relate to an operational amplifier-based hysteresis comparator and a chip, to partially or completely solve the above technical problems by changing the hysteresis voltage generation mode of the hysteresis comparator.

According to a first aspect of the present disclosure, an operational amplifier-based hysteresis comparator is provided. The hysteresis comparator is configured to compare a first voltage with a second voltage, the hysteresis comparator includes: an input stage and an amplification stage connected with the input stage, where the input stage includes: a first input branch and a second input branch, where the first input branch generates a first current based on the first voltage, and the second input branch generates a second current based on the second voltage, the first input branch includes N number of connected input sub-branches, N is determined based on a first selection signal, and when N is greater than or equal to 2, N input sub-branches are connected in parallel, the second input branch includes M number of connected input sub-branches, M is determined based on a second selection signal, and when M is greater than or equal to 2, M input sub-branches are connected in parallel, M and N are positive integers, and at least one of M and N is greater than or equal to 2, and the amplification stage includes: a first input terminal, a second input terminal, and an output terminal, the first current is connected with the first input terminal, the second current is connected with the second input terminal, the output terminal outputs a first level when the first current is greater than the second current, the output terminal outputs a second level when the first current is less than the second current, the first level is a high level, and the second level is a low level.

According to a second aspect of the present disclosure, a chip is provided, including the above hysteresis comparator.

The input stage of the hysteresis comparator in the embodiments of the present disclosure includes: the first input branch and the second input branch. The first input branch includes N number of connected input sub-branches, N is determined based on the first selection signal, the second input branch includes M number of connected input sub-branches, M is determined based on the second selection signal, and at least one of M and N is greater than or equal to 2, such that the number of input sub-branches of the first input branch and/or the second input branch of the input stage of the operational amplifier can be changed, thereby changing the effective width-to-length ratio of the first input branch and/or the second input branch, to provide a negative hysteresis window and/or a positive hysteresis window for generating a hysteresis voltage. In the embodiments of the present disclosure, the instability caused by positive feedback is reduced, a small number of transistors are used, and the layout area and power consumption of the hysteresis comparator are reduced.

DESCRIPTION OF DRAWINGS

To more clearly describe the technical solutions of the embodiments of the present disclosure or existing technologies, the accompanying drawings to be used in the description of the embodiments or the existing technologies will be briefly introduced below. Apparently, the drawings described below are some embodiments of the present disclosure. For those of ordinary skills in the art, other drawings may also be obtained based on these drawings without making creative work.

DETAILED DESCRIPTION OF EMBODIMENTS

To cause those skilled in the art to better understand the solutions in the present disclosure, the technical solutions in the embodiments of the present disclosure will be clearly and completely described below with reference to the drawings in the embodiments of the present disclosure. Apparently, the described embodiments are some embodiments, rather than all embodiments, of the present disclosure. All other embodiments obtained by those of ordinary skills in the art based on the embodiments of the present disclosure without making creative work are encompassed within the scope of protection of the present disclosure.

Figure 1:
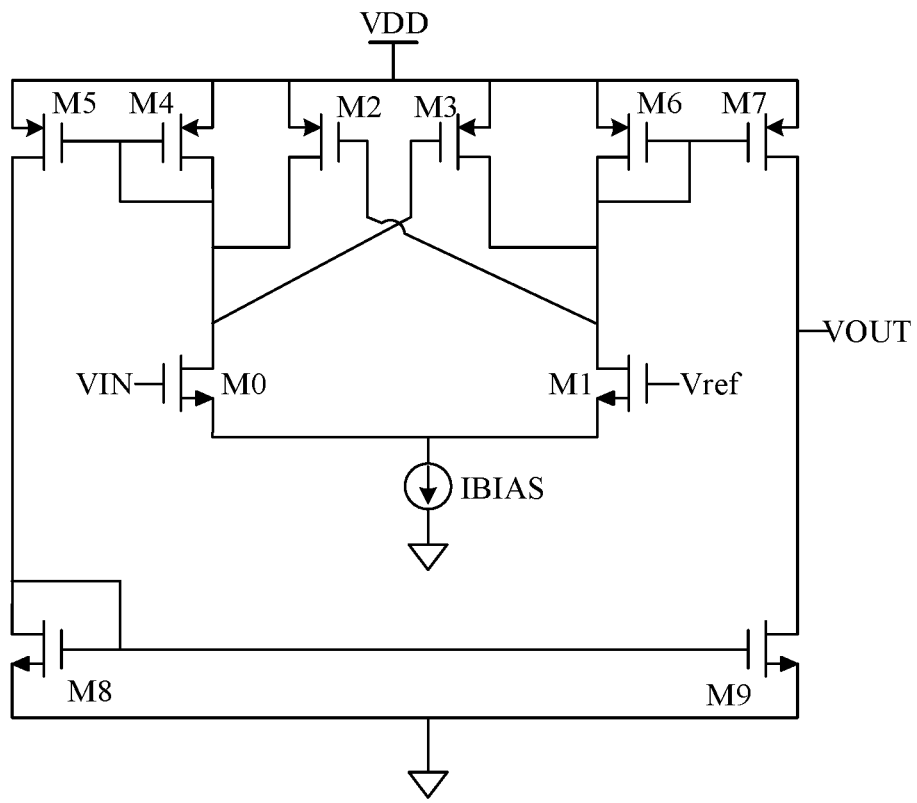
FIG. 1 is a schematic circuit diagram of a hysteresis comparator of a related technology.

FIG. 1 shows a hysteresis comparator of a related technology. The hysteresis comparator includes transistors M0-M9 and a current source IBIAS. When an input voltage VIN is greater than a reference voltage Vref, most of a bias current provided by the current source IBIAS flows through the transistor M0, and only a very small part of, or even no, current flows through the transistor M1. In this case, an output signal VOUT is a low level. When the VIN changes from large to small, a current flowing through the transistors M1 and M3 gradually increases. When the current flowing through the transistors M1 and M3 is equal to a current flowing through the transistors M0 and M2, level of the output signal VOUT will turn over. The hysteresis comparator shown in FIG. 1 generates positive feedback using the transistors M2 and M3 to implement hysteresis. In order to guarantee the circuit stability, there is usually negative feedback in a circuit, and if there is also positive feedback in the circuit, strength of the negative feedback must be greater than strength of the positive feedback, which is the basic principle of circuit design. Therefore, the positive feedback generated by the transistors M2 and M3 in FIG. 1 introduces instability factors into the circuit.

Figure 2:
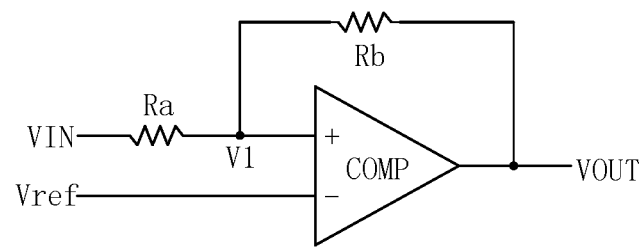
FIG. 2 is a schematic circuit diagram of another hysteresis comparator of a related technology.

FIG. 2 shows another hysteresis comparator of a related technology, which is a comparator achieving a hysteresis function by forming positive feedback with an external resistor. The hysteresis comparator shown in FIG. 2 includes: a comparator COMP, a resistor Ra, and a resistor Rb. The hysteresis comparator shown in FIG. 2 uses a positive feedback path added outside an operational amplifier. The hysteresis comparator in FIG. 2 not only has a potential instability risk caused by the positive feedback, but also occupies a large area.

Hence, how to change the hysteresis voltage generation mode to obtain favorable output characteristics is a problem to be urgently solved by those skilled in the art. The present disclosure presents an operational amplifier-based hysteresis comparator, which changes the number of input sub-branches of the first input branch and/or the second input branch of the input stage, thereby changing the effective width-to-length ratio of the first input branch and/or the second input branch, to provide a negative hysteresis window and/or a positive hysteresis window for generating a hysteresis voltage. The embodiments of the present disclosure reduce the instability caused by positive feedback. Further, in the embodiments of the present disclosure, a small number of transistors are used, thereby reducing the layout area and power consumption of the hysteresis comparator.

Figure 3:
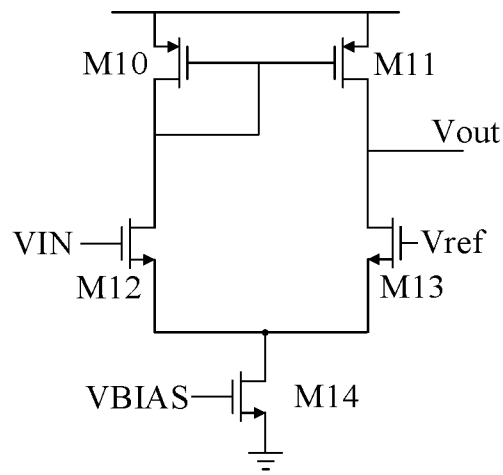
FIG. 3 is a typical circuit diagram of an operational amplifier.

FIG. 3 is a typical circuit diagram of an operational amplifier. As shown in FIG. 3, the operational amplifier includes: PMOS transistors M10 and M11, and NMOS transistors M12, M13, and M14. The PMOS transistor M10 and the NMOS transistor M12 are connected in series. The PMOS transistor M11 and the NMOS transistor M13 are connected in series. The PMOS transistors M10 and M11 form a current mirror. A source of the NMOS transistor M12 and a source of the NMOS transistor M13 are connected to a drain of the NMOS transistor M14. A grid of the NMOS transistor M14 receives a bias voltage VBIAS, to provide a bias current. A grid of the NMOS transistor M12 receives an input voltage VIN, and a grid of the NMOS transistor M13 receives a reference voltage Vref. The NMOS transistors M12 and M13 have the same width-to-length ratio, and the NMOS transistors M10 and M11 have the same width-to-length ratio. A current of the NMOS transistor M12 is copied to the PMOS transistor M11 via a current mirror. When the input voltage VIN is greater than the reference voltage Vref, the current of the NMOS transistor M12 is greater than that of the NMOS transistor M13, and an output voltage Vout is a high level. When the input voltage VIN is less than the reference voltage Vref, the current of the NMOS transistor M12 is less than that of the NMOS transistor M13, and the output voltage Vout is a low level.

If the width-to-length ratio of the NMOS transistor M12 is not equal to that of the NMOS transistor M13, a turnover point of the output voltage Vout is no longer the input voltage VIN being equal to the reference voltage Vref. If the width-to-length ratio of the NMOS transistor M12 is greater than that of the NMOS transistor M13, and the input voltage VIN is greater than a first turnover voltage, the output voltage Vout becomes a high level. The first turnover voltage is less than the reference voltage Vref. Only when the width-to-length ratio of the NMOS transistor M12 is less than that of the NMOS transistor M13, and the input voltage VIN is greater than a second turnover voltage, the output voltage Vout becomes a high level. The first turnover voltage is greater than the reference voltage Vref. However, after the production of the NMOS transistors M12 and M13 is completed, the width-to-length ratio cannot be changed, nor can the first turnover voltage and second turnover voltage be changed.

The present disclosure provides an operational amplifier-based hysteresis comparator. The hysteresis comparator may be based on any type of operational amplifier, such as the operational amplifier shown in FIG. 3, an operational amplifier with a plurality of amplification stages, a cascode operational amplifier, and a foldable cascode operational amplifier. The hysteresis comparator is configured to compare a first voltage with a second voltage. Specifically, the hysteresis comparator is configured to compare hysteresis of the first voltage with hysteresis of the second voltage. The hysteresis comparator includes: an input stage and an amplification stage connected to the input stage. The input stage includes: a first input branch and a second input branch. The first input branch generates a first current based on the first voltage, and the second input branch generates a second current based on the second voltage. The first input branch includes N number of connected input sub-branches, and if N is greater than or equal to 2, N input sub-branches are connected in parallel. The second input branch includes M number of connected input sub-branches, and if M is greater than or equal to 2, M input sub-branches are connected in parallel. N is determined based on a first selection signal, M is determined based on a second selection signal, M and N are positive integers, and at least one of M and N is greater than or equal to 2. The amplification stage includes: a first input terminal, a second input terminal, and an output terminal, the first current is connected with the first input terminal, the second current is connected with the second input terminal, the output terminal outputs a first level when the first current is greater than the second current, the output terminal outputs a second level when the first current is less than the second current, the first level is a high level, and the second level is a low level. That is, when the first level is a high level, the second level is a low level; and when the first level is a low level, the second level is a high level.

The first input branch includes N number of connected input sub-branches, and the second input branch includes M number of connected input sub-branches. The number of M and/or N is changed based on the first selection signal and/or the second selection signal, to change the number of input sub-branches of the first input branch and/or the second input branch of the input stage, thereby changing the effective width-to-length ratio of the first input branch and/or the second input branch, to provide a negative hysteresis window and/or a positive hysteresis window for generating a hysteresis voltage. Compared with the hysteresis comparator which achieves hysteresis using positive feedback in FIG. 1 and FIG. 2, the hysteresis comparator in the embodiment of the present disclosure reduces the instability caused by positive feedback. Further, compared with the hysteresis comparator in FIG. 1 and FIG. 2, in the embodiment of the present disclosure, a small number of transistors are used, thereby reducing the layout area and power consumption of the hysteresis comparator.

If N is a positive integer greater than or equal to 2, the hysteresis comparator provides a negative hysteresis window; and if M is a positive integer greater than or equal to 2, the hysteresis comparator provides a positive hysteresis window.

Figure 4:
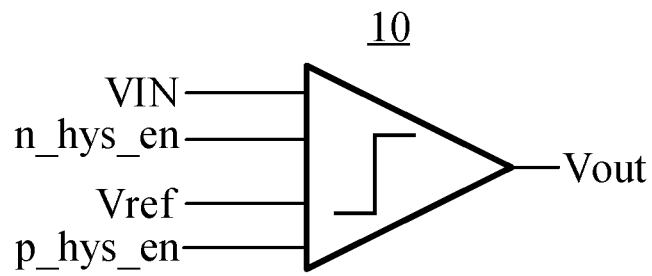
FIG. 4 is a schematic block diagram of a hysteresis comparator in an embodiment of the present disclosure.

FIG. 4 is a schematic block diagram of a hysteresis comparator in an embodiment of the present disclosure. The hysteresis comparator 10 receives a first voltage VIN, a second voltage Vref, a first enable signal n_hys_en, and a second enable signal p_hys_en. The first voltage VIN and the second voltage Vref are analog signals. The first enable signal n_hys_en and the second enable signal p_hys_en are digital signals. The hysteresis comparator 10 is configured to compare a size of the first voltage VIN with that of the second voltage Vref. The hysteresis comparator 10 outputs a binary digital signal of a high/low level. For example, the hysteresis comparator 10 outputs "1" representing a high level or "0" representing a low level. The first enable signal n_hys_en and the second enable signal p_hys_en are used for setting a hysteresis mode of the hysteresis comparator 10. The hysteresis comparator 10 may have three hysteresis modes, namely a first hysteresis mode, a second hysteresis mode, and a third hysteresis mode. In the first hysteresis mode, the hysteresis comparator 10 has a positive hysteresis window and a negative hysteresis window. In the second hysteresis mode, the hysteresis comparator 10 has a negative hysteresis window. In the third hysteresis mode, the hysteresis comparator 10 has a positive hysteresis window. In some embodiments, the hysteresis comparator 10 may also have one or two of the first hysteresis mode, the second hysteresis mode, and the third hysteresis mode. In FIG. 4, hysteresis comparator 10 has, e.g., three hysteresis modes. The first enable signal n_hys_en and the second enable signal p_hys_en are used for selecting a hysteresis mode of the hysteresis comparator 10. For example, when the first enable signal n_hys_en is a high level, the negative hysteresis window is enabled, and the second hysteresis mode is selected; when the second enable signal p_hys_en is a high level, the positive hysteresis window is enabled, and the third hysteresis mode is selected; and when both the first enable signal n_hys_en and the second enable signal p_hys_en are high levels, both the positive hysteresis window and the negative hysteresis window are enabled, and the first hysteresis mode is selected.

Figure 5:
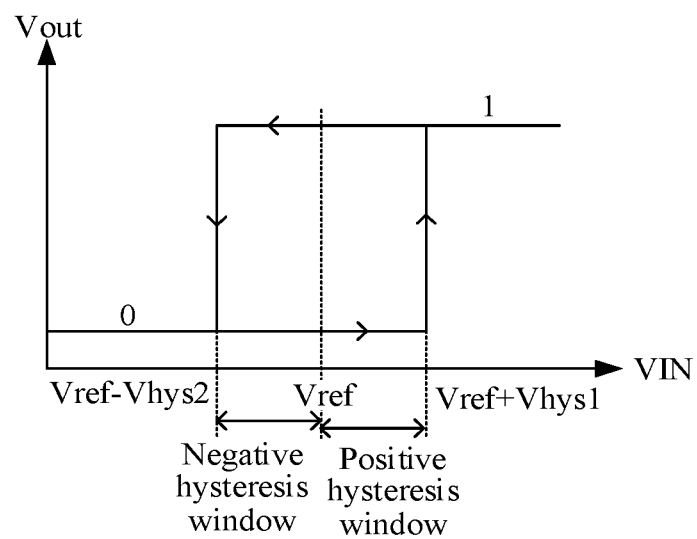
FIG. 5 shows an output characteristic of a hysteresis comparator in an embodiment of the present disclosure.

FIG. 5 shows an output characteristic of a hysteresis comparator in a first hysteresis mode. The hysteresis comparator 10 has a positive hysteresis window and a negative hysteresis window. For example, the second voltage Vref is a constant-sized voltage. The first voltage VIN increases from a voltage less than the second voltage Vref. When the first voltage VIN is less than the second voltage Vref, the hysteresis comparator 10 outputs "0" representing a low level. When the first voltage VIN increases to the second voltage Vref, an output signal of the hysteresis comparator 10 does not turn over (turn over, i.e., the output signal changes between the high level and the low level). When the first voltage VIN increases to the second voltage Vref plus a hysteresis voltage Vhsy1, the output signal of the hysteresis comparator 10 turns over. When the first voltage VIN is greater than the second voltage Vref plus the hysteresis voltage Vhsy1, the hysteresis comparator 10 outputs "1" representing a high level. As shown in FIG. 5, the positive hysteresis window is (Vref, Vref+Vhsy1), i.e., a hysteresis window when the first voltage VIN increases.

The first voltage VIN decreases from a voltage greater than the second voltage Vref. When the first voltage VIN is greater than the second voltage Vref, the hysteresis comparator 10 outputs "1" representing a high level. When the first voltage VIN is equal to the second voltage Vref, the output signal of the hysteresis comparator 10 does not turn over. When the first voltage VIN is equal to the second voltage Vref minus a hysteresis voltage Vhsy2, the output signal of the hysteresis comparator 10 turns over. When the first voltage VIN is less than the second voltage Vref minus the hysteresis voltage Vhsy2, the hysteresis comparator 10 outputs "0" representing a low level. As shown in FIG. 5, the negative hysteresis window is (Vref−Vhsy2, Vref), i.e., a hysteresis window when the first voltage VIN decreases. The hysteresis voltage Vhsy1 may be the same as or different from the hysteresis voltage Vhsy2.

Figure 6:
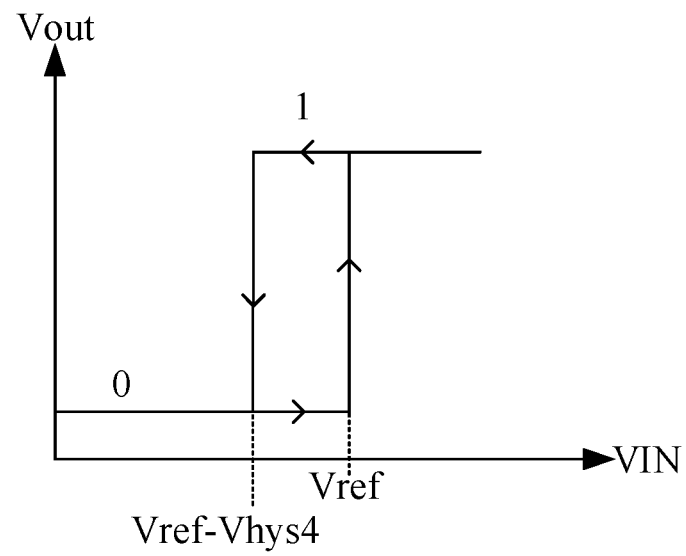
FIG. 6 shows another output characteristic of a hysteresis comparator in an embodiment of the present disclosure.

FIG. 6 shows an output characteristic of a hysteresis comparator in a second hysteresis mode. The hysteresis comparator 10 has a negative hysteresis window. For example, the second voltage Vref is a constant-sized voltage. The first voltage VIN increases from a voltage value less than the second voltage Vref. When the first voltage VIN is equal to the second voltage Vref, the output signal of the hysteresis comparator 10 turns over. The first voltage VIN decreases from a voltage value greater than the second voltage Vref. When the first voltage VIN is greater than the second voltage Vref, the hysteresis comparator 10 outputs "1" representing a high level. When the first voltage VIN is equal to the second voltage Vref, the output signal of the hysteresis comparator 10 does not turn over. When the first voltage VIN is equal to the second voltage Vref minus a hysteresis voltage Vhsy4, the output signal of the hysteresis comparator 10 turns over. When the first voltage VIN is less than the second voltage Vref minus the hysteresis voltage Vhsy4, the hysteresis comparator 10 outputs "0" representing a low level.

Figure 7:
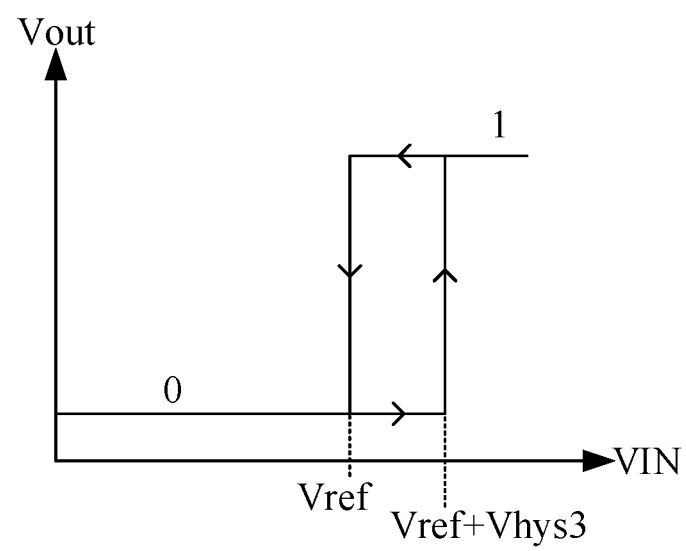
FIG. 7 shows still another output characteristic of a hysteresis comparator in an embodiment of the present disclosure.

FIG. 7 shows an output characteristic of a hysteresis comparator in a third hysteresis mode in an embodiment of the present disclosure. The hysteresis comparator 10 has a positive hysteresis window. For example, the second voltage Vref is a constant-sized voltage. The first voltage VIN increases from a voltage value less than the second voltage Vref. When the first voltage VIN is less than the second voltage Vref, the hysteresis comparator 10 outputs "0" representing a low level. When the first voltage VIN is equal to the second voltage Vref, the output signal of the hysteresis comparator 10 does not turn over. When the first voltage VIN is equal to the second voltage Vref plus a hysteresis voltage Vhsy3, the output signal of the hysteresis comparator 10 turns over. When the first voltage VIN is greater than the second voltage Vref plus the hysteresis voltage Vhsy3, the hysteresis comparator 10 outputs "1" representing a high level. The first voltage VIN decreases from a voltage value greater than the second voltage Vref. When the first voltage VIN is greater than the second voltage Vref, the hysteresis comparator 10 outputs "1" representing a high level. When the first voltage VIN is equal to the second voltage Vref, the output signal of the hysteresis comparator 10 turns over. When the first voltage VIN is less than the second voltage Vref, the hysteresis comparator 10 outputs "0" representing a low level.

An implementation of the hysteresis comparator 10 is described below with reference to an embodiment.

Figure 8:
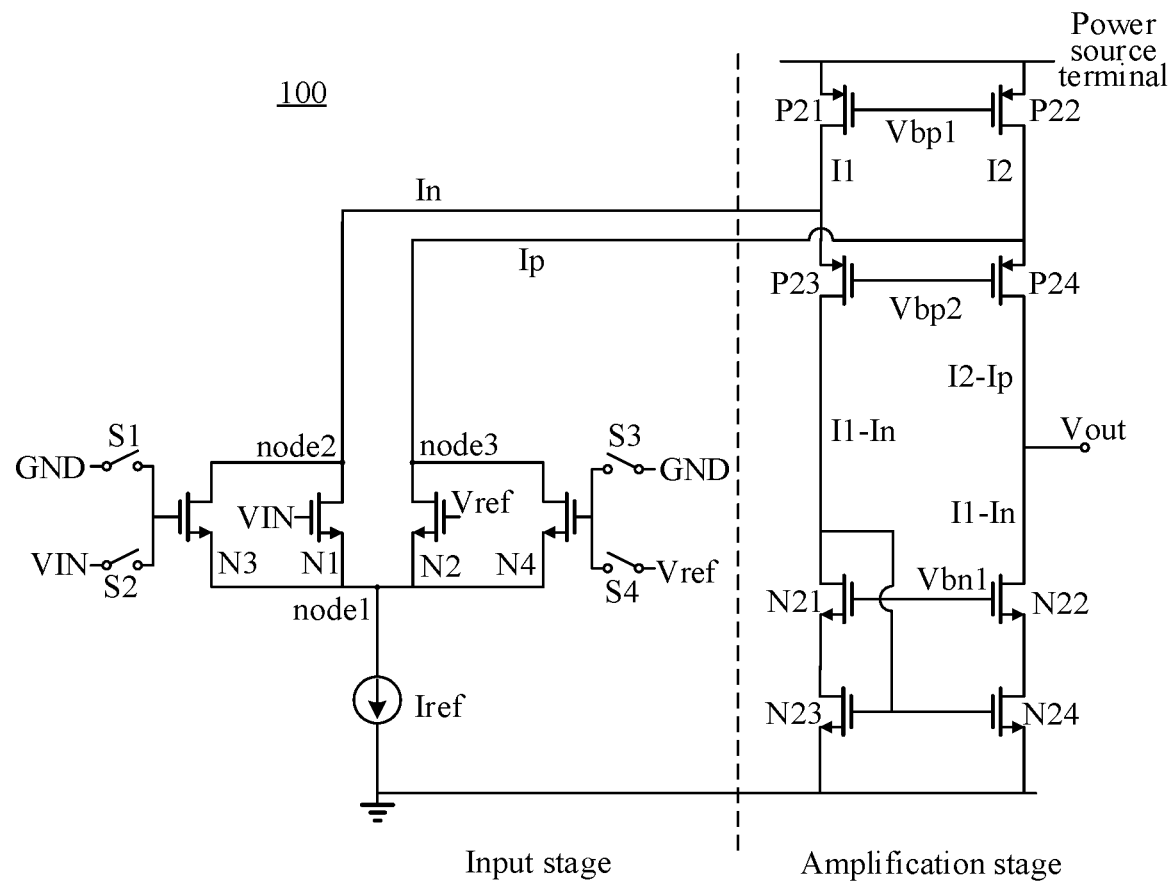
FIG. 8 shows a circuit diagram of a hysteresis comparator in an embodiment of the present disclosure.

FIG. 8 shows a circuit diagram of a hysteresis comparator in an embodiment of the present disclosure. As shown in FIG. 8, the hysteresis comparator 100 includes an input stage and an amplification stage. The input stage includes: a current source Iref, NMOS transistors N1-N4, and first switch S1, second switch S2, third switch S3 and fourth switch S4. The current source Iref is arranged between a node node1 and the ground, for providing a bias current (also referred to as a tail current). The first input branch is arranged between the node node1 and a node node2. The second input branch is arranged between the node node1 and a node node3.

The first input branch includes a first input sub-branch and a second input sub-branch. The first input sub-branch includes a first input transistor (NMOS transistor N3), a grid of the first input transistor (NMOS transistor N3) is selected to receive one of the first voltage VIN and an off voltage based on the first selection signal, the first input sub-branch is connected in parallel to the second input sub-branch when the grid of the first input transistor (NMOS transistor N3) receives the first voltage VIN, and the first input sub-branch is disconnected from the other input sub-branch of the first input branch when the grid of the first input transistor (NMOS transistor N3) receives the off voltage. The second input sub-branch of the first input branch includes a second input transistor (NMOS transistor N1), and a grid of the second input transistor (NMOS transistor N1) receives the first voltage. A drain of the second input transistor (NMOS transistor N1) is connected to the node node2, a source of the second input transistor (NMOS transistor N1) is connected to the node node1, and a grid of the second input transistor (NMOS transistor N1) receives the first voltage VIN. The second input transistor (NMOS transistor N1) generates a current based on the first voltage VIN.

Specifically, the first input sub-branch includes the first input transistor (NMOS transistor N3) and the first switch S1 and second switch S2.

A drain of the first input transistor (NMOS transistor N3) is connected to the node node2, a source of the first input transistor (NMOS transistor N3) is connected to the node node1, and a grid of the first input transistor (NMOS transistor N3) is connected to a first terminal of the first switch S1 and a first terminal of a second switch S2. A second terminal of the first switch S1 is connected to a terminal providing the off voltage. The off voltage of the first input transistor (NMOS transistor) is the ground level (GND). A second terminal of the second switch S2 is connected to a terminal providing the first voltage VIN. Switch-on and switch-off of the first switches S1 and S2 are controlled based on the first selection signal n_hys.

For example, when the first selection signal n_hys is a high level, the first switch S1 is switched off, and the second switch S2 is switched on; and when the first selection signal n_hys is a low level, the first switch S1 is switched on, and the second switch S2 is switched off. When the first switch S1 is switched off, and the second switch S2 is switched on, the grid of the first input transistor (NMOS transistor N3) receives the first voltage VIN, the first input transistor (NMOS transistor N3) generates a current based on the first voltage VIN, the first input sub-branch is connected in parallel to the second input sub-branch, and the first input branch includes 2 input sub-branches connected in parallel. When the first switch S1 is switched on, and the second switch S2 is switched off, the grid of the NMOS transistor N3 receives the off voltage, the NMOS transistor N3 is switched off, the first input sub-branch is disconnected from the second input sub-branch, and the first input branch includes 1 input sub-branch, i.e., the second input sub-branch.

The second input transistor (NMOS transistor N1) and the first input transistor (NMOS transistor N3) may have the same width-to-length ratio, or may have different width-to-length ratios.

The second input branch includes a third input sub-branch and a fourth input sub-branch. The fourth input sub-branch of the second input branch includes a fourth input transistor (NMOS transistor N4), a grid of the fourth input transistor (NMOS transistor N4) is selected to receive one of the second voltage Vref and the off voltage based on the second selection signal, the fourth input sub-branch is connected in parallel to the third input sub-branch when the grid of the fourth input transistor (NMOS transistor N4) receives the second voltage Vref, the fourth input sub-branch is disconnected from the third input sub-branch when the grid of the fourth input transistor (NMOS transistor N4) receives the off voltage, the third input sub-branch includes a third input transistor (NMOS transistor N2), and a grid of the third input transistor (NMOS transistor N2) receives the second voltage. A drain of the third input transistor (NMOS transistor N2) is connected to the node node3, a source of the third input transistor (NMOS transistor N2) is connected to the node node1, and the grid of the third input transistor (NMOS transistor N2) receives the second voltage Vref.

Specifically, the fourth input sub-branch includes the fourth input transistor (NMOS transistor N4) and third switch S3 and fourth switch S4. A drain of the fourth input transistor (NMOS transistor N4) is connected to the node node3, a source of the fourth input transistor (NMOS transistor N4) is connected to the node node1, and the grid of the fourth input transistor (NMOS transistor N4) is connected to a first terminal of the third switch S3 and a first terminal of the fourth switch S4. A second terminal of the third switch S3 is connected to a terminal providing the off voltage. A second terminal of the fourth switch S4 is connected to a terminal providing the second voltage Vref. Switch-on and switch-off of the third switches S3 and S4 are controlled based on the second selection signal p_hys.

For example, when the second selection signal p_hys is a high level, the third switch S3 is switched off, and the fourth switch S4 is switched on; and when the second selection signal p_hys is a low level, the third switch S3 is switched on, and the fourth switch S4 is switched off. When the third switch S3 is switched off, and the fourth switch S4 is switched on, the grid of the fourth input transistor (NMOS transistor N4) receives the second voltage Vref, the third input sub-branch is connected in parallel to the fourth input sub-branch, and the second input branch includes 2 input sub-branches connected in parallel. When the third switch S3 is switched on, and the fourth switch S4 is switched off, the grid of the fourth input transistor (NMOS transistor N4) receives the off voltage, the fourth input transistor (NMOS transistor N4) is disconnected from the third input sub-branch, and the second input branch includes 1 input sub-branch, i.e., the third input sub-branch.

The NMOS transistor N2 and the NMOS transistor N4 may have the same width-to-length ratio, or may have different width-to-length ratios.

A current In of the first input branch depends on a size of the first voltage VIN and the number of input sub-branches in the first input branch. A current Ip of the second input branch depends on a size of the second voltage Vref and the number of input sub-branches in the second input branch.

Figure 10:
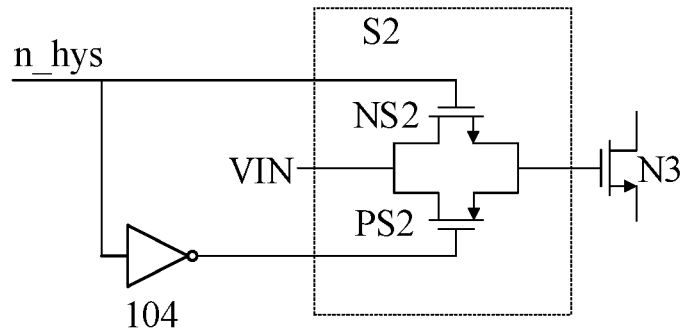
FIG. 10 shows an implementation of a switch.

Specifically, a transmission gate is preferably used for the second switch S2 and the fourth switch S4. FIG. 10 shows a circuit diagram of the second switch S2 implemented using a transmission gate. The fourth switch S4 is the same as the second switch S2, so that the description will not be repeated. The second switch S2 includes a PMOS transistor PS2 and an NMOS transistor NS2 in parallel. A drain of the PMOS transistor PS2 and a drain of the NMOS transistor NS2 receive the first voltage or the second voltage in parallel, a source of the PMOS transistor PS2 and a source of the NMOS transistor NS2 are connected in parallel to the grid of the first input transistor or the grid of the fourth input transistor. A grid of the NMOS transistor NS2 receives the first selection signal n_hys, and the grid of the PMOS transistor PS2 receives an inversion signal of the first selection signal n_hys. For example, the first selection signal n_hys is supplied to the grid of the PMOS transistor PS2 through a phase inverter 104. Implementation of the second switch S2 using the transmission gate can guarantee that the first voltage VIN is transmitted to the grid of the NMOS transistor N3, avoid voltage loss on the second switch S2, and guarantee that the grid of the NMOS transistor N1 and the grid of the NMOS transistor N3 receive the same first voltage. The first switch S1 and the third switch S3 are configured to transmit the ground level GND, and the transmission gate or the NMOS transistor may be selected.

The amplification stage includes: PMOS transistors P21-P24 and NMOS transistors N21-N24. The PMOS transistors P21 and P23 and the NMOS transistors N21 and N23 are successively connected in series between a power source terminal and the ground. The PMOS transistors P22 and P24 and the NMOS transistors N22 and N24 are successively connected in series between the power source terminal and the ground. A grid of the PMOS transistor P21 and a grid of the PMOS transistor P22 receive a bias voltage Vbp1. The PMOS transistors P21 generates a current I1, and the PMOS transistor P22 generates a current I2. A grid of the PMOS transistor P23 and a grid of the PMOS transistor P24 receive a bias voltage Vbp2. A grid of the NMOS transistor N21 and a grid of the NMOS transistor N22 receive a bias voltage Vbn1. A grid of the NMOS transistor N23 and a grid of the NMOS transistor N24 are connected to a drain of the NMOS transistor N21. A drain of the PMOS transistor P21 and a source of the PMOS transistor P23 are connected to the node node2. A drain of the PMOS transistor P22 and a source of the PMOS transistor P24 are connected to the node node3. A drain of the PMOS transistors P24 is connected to a drain of the NMOS transistor N22, for use as an output terminal of the hysteresis comparator 100.

In the amplification stage, a current flowing through the NMOS transistors N21 and N23 is equal to I1-In. The current I1-In is copied to the NMOS transistors N22 and N24 via a current mirror composed of the NMOS transistors N23 and N24. A current flowing through the PMOS transistor P24 is I2-Ip. The current I1-In and the current I2-Ip determine whether an output voltage of the hysteresis comparator 100 is a high level or a low level. If the PMOS transistors P21 and P22 have the same width-to-length ratio, I1 is equal to I2, i.e., whether the output voltage of the hysteresis comparator 100 is a high level or a low level depends on the current In of the first input branch and the current Ip of the second input branch. When the current I1-In is greater than the current I2-Ip, the output voltage Vout of the hysteresis comparator 100 is a low level. When the current I1-In is less than the current I2-Ip, the output voltage Vout of the hysteresis comparator 100 is a high level.

Figure 9:
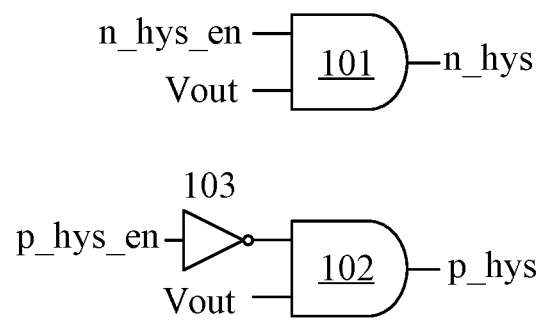
FIG. 9 shows a generation circuit of a first selection signal and a second selection signal.

FIG. 9 shows a generation circuit of a first selection signal n_hys and a second selection signal p_hys. The first selection signal n_hys is generated through an AND gate 101 based on the first enable signal n_hys_en and the output terminal of the hysteresis comparator 100. Two input terminals of the AND gate 101 are connected with the first enable signal n_hys_en and the output terminal of the hysteresis comparator 100 respectively. The second selection signal p_hys is generated through an AND gate 102 and a phase inverter 103 based on the second enable signal n_hys_en and the output terminal of the hysteresis comparator 100. An input terminal of the phase inverter 103 is connected with the second enable signal p_hys_en, and two input terminals of the AND gate 102 are connected to an output terminal of the phase inverter 103 and the output terminal of the hysteresis comparator 100 respectively. When the hysteresis mode of the hysteresis comparator 100 is selected, the first enable signal n_hys_en and the second enable signal p_hys_en remain constant, and the first selection signal n_hys and the second selection signal p_hys change with the output voltage Vout of the hysteresis comparator 100, so that the generation circuit of the first selection signal n_hys and the second selection signal p_hys is a feedback path of the hysteresis comparator 100.

The output voltage Vout of the hysteresis comparator 100 is supplied as a feedback signal to the generation circuit of the first selection signal n_hys and the second selection signal p_hys, a Schmidt trigger is provided at an output terminal of the amplification stage, and an input terminal of the Schmidt trigger is connected to the output terminal of the amplification stage. The output terminal of the Schmidt trigger serves as the output terminal of the hysteresis comparator 100, thereby stabilizing the output of the hysteresis comparator 100, and avoiding repeated glitch between 0 and 1. The Vout outputted from the output terminal of the Schmidt trigger is supplied as a feedback signal to the generation circuit of the first selection signal n_hys and the second selection signal p_hys, such that more stable Vout can be obtained.

Figure 11:
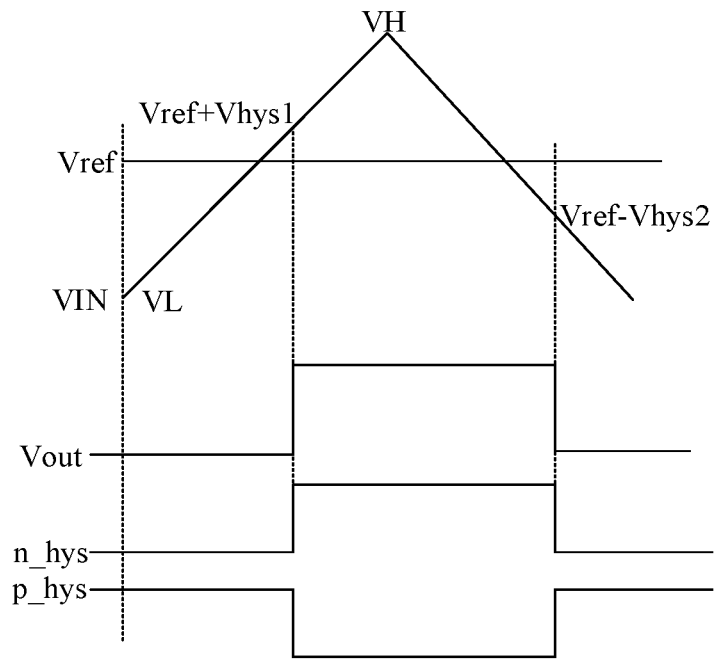
FIG. 11 shows an oscillogram of the hysteresis comparator shown in FIG. 8.

FIG. 11 shows an oscillogram of the hysteresis comparator shown in FIG. 8. A working process of the hysteresis comparator is described below with reference to FIG. 8, FIG. 9, and FIG. 11. For example, the second input transistor (NMOS transistor N1) and the third input transistor (NMOS transistor N2) have the same width-to-length ratio. Both the first enable signal n_hys_en and the second enable signal p_hys_en are high levels. The hysteresis comparator 100 can provide a positive hysteresis window and a negative hysteresis window. The second voltage Vref is a constant-sized voltage. The first voltage VIN increases from a voltage VL less than the second voltage Vref to a voltage VH greater than the second voltage Vref, and then decreases from the voltage VH to VL.

If the first enable signal n_hys_en enables the negative hysteresis window and an output level of the hysteresis comparator is a low level, the first selection signal is a low level; or if the first enable signal enables the negative hysteresis window and the output level of the hysteresis comparator is a high level, the first selection signal is a high level; and if the second enable signal p_hys_en enables the positive hysteresis window, and the output level of the hysteresis comparator is a low level, the second selection signal is a high level; or if the second enable signal enables the positive hysteresis window and the output level of the hysteresis comparator is a high level, the second selection signal is a low level.

In the initial stage, the first voltage VIN is less than the second voltage Vref. As shown in FIG. 9, the first selection signal n_hys is 0, the second selection signal p_hys is 1, the second switches S2 and S3 are switched off, and the first switches S1 and S4 are switched on. The grid of the first input transistor (NMOS transistor N3) is connected with an off voltage, and the first input transistor (NMOS transistor N3) is disconnected. The grid of the fourth input transistor (NMOS transistor N4) is connected with the second voltage Vref. The current In of the first input branch is equal to a current of the second input transistor (NMOS transistor N1). The current Ip of the second input branch is equal to a current of the third input transistor (NMOS transistor N2) and a current of the fourth input transistor (NMOS transistor N4). The current of the second input transistor (NMOS transistor N1) depends on the size of the first voltage VIN, the current of the third input transistor (NMOS transistor N2) depends on the size of the second voltage Vref, and the current of the fourth input transistor (NMOS transistor N4) depends on the size of the second voltage Vref. The current In of the first input branch is less than the current Ip of the second input branch, and the hysteresis comparator 100 outputs a low level.

When the first voltage VIN is equal to the second voltage Vref, the current In of the first input branch is still less than the current Ip of the second input branch, and the output voltage Vout of the hysteresis comparator 100 remains a low level.

When the first voltage VIN is equal to the second voltage Vref plus the hysteresis voltage Vhsy1, the current In of the first input branch is equal to the current Ip of the second input branch, and the output voltage Vout of the hysteresis comparator 100 turns over.

When the first voltage VIN is greater than the second voltage Vref plus the hysteresis voltage Vhsy1, the output voltage Vout of the hysteresis comparator 100 is a high level, the first selection signal n_hys is 1, the second selection signal p_hys is 0, the second switches S2 and S3 are switched on, and the first switches S1 and S4 are switched off. The grid of the first input transistor (NMOS transistor N3) is connected with the first voltage VIN, and the current In of the first input branch is equal to the current of the second input transistor (NMOS transistor N1) and the current of the first input transistor (NMOS transistor N3). The fourth input transistor (NMOS transistor N4) is connected with the off voltage, the fourth input transistor (NMOS transistor N4) is disconnected, and the current Ip of the second input branch is equal to the current of the third input transistor (NMOS transistor N2). The current In of the first input branch is greater than the current Ip of the second input branch. When the first voltage VIN increases, (Vref, Vref+Vhsy1) achieves the positive hysteresis window.

When the first voltage VIN increases from Vref+Vhsy1 to VH, and then decreases to the second voltage Vref, the current In of the first input branch is equal to the current of the second input transistor (NMOS transistor N1) and the current of the first input transistor (NMOS transistor N3), and the current Ip of the second input branch is equal to the current of the third input transistor (NMOS transistor N2). The output voltage Vout of the hysteresis comparator 100 remains a high level.

When the first voltage VIN decreases to the second voltage Vref, the output voltage Vout of the hysteresis comparator 100 does not turn over. When the first voltage VIN decreases from the second voltage Vref to the second voltage Vref minus the hysteresis voltage Vhsy2, the current In of the second input branch gradually decreases, but is still greater than the current Ip of the second input branch, and the output voltage Vout of the hysteresis comparator 100 remains a high level. When the first voltage VIN decreases, (Vref−Vhsy2, Vref) achieves the negative hysteresis window.

When the first voltage VIN decreases to the second voltage Vref minus the hysteresis voltage Vhsy2, the current In of the first input branch is equal to the current Ip of the second input branch, and the output voltage Vout of the hysteresis comparator 100 turns over.

When the first voltage VIN further decreases from the second voltage Vref minus the hysteresis voltage Vhsy2, the output voltage Vout of the hysteresis comparator 100 is a low level, the first selection signal n_hys is 0, the second selection signal p_hys is 1, the second switches S2 and S3 are switched off, and the first switches S1 and S4 are switched on. The grid of the first input transistor (NMOS transistor N3) is connected with the off voltage, and the first input transistor (NMOS transistor N3) is disconnected. The grid of the fourth input transistor (NMOS transistor N4) is connected with the second voltage Vref. The current In of the first input branch is equal to the current of the second input transistor (NMOS transistor N1). The current Ip of the second input branch is equal to a current of the third input transistor (NMOS transistor N2) and a current of the fourth input transistor (NMOS transistor N4).

A ratio of the width-to-length ratio of the NMOS transistor N1 to the width-to-length ratio of the NMOS transistor N3 may be changed to adjust a size of the negative hysteresis window. A ratio of the width-to-length ratio of the third input transistor (NMOS transistor N2) to the width-to-length ratio of the fourth input transistor (NMOS transistor N4) may be changed to adjust a size of the positive hysteresis window. In some embodiments, the first input branch includes more than 2 input sub-branches, i.e., is provided with a plurality of first input transistors (NMOS transistor N3), and the grid of each of the first input transistors (NMOS transistor N3) is selected to be connected with the first voltage VIN and the off voltage, thus providing more-sized negative hysteresis windows. The plurality of first input transistors (NMOS transistor N3) may have different width-to-length ratios, such as increasing or decreasing width-to-length ratios of the plurality of first input transistors (NMOS transistor N3), thus facilitating dynamic adjustment using software. In some embodiments, the second input branch includes more than 2 input sub-branches, i.e., is provided with a plurality of fourth input transistors (NMOS transistor N4), and the grid of each of the fourth input transistors (NMOS transistor N4) is selected to be connected with the second voltage Vref and the off voltage, thus providing more-sized positive hysteresis windows. Similarly, the plurality of fourth input transistors (NMOS transistor N4) may have different width-to-length ratios, such as increasing or decreasing width-to-length ratios of the plurality of fourth input transistors (NMOS transistor N4).

When the first enable signal n_hys_en is 1, and the second enable signal p_hys_en is 0, the negative hysteresis window is enabled. The output characteristics of the hysteresis comparator 100 are shown in FIG. 7, and the description of the specific process will not be repeated. When the first enable signal n_hys_en is 0, and the second enable signal p_hys_en is 1, the positive hysteresis window is enabled. The output characteristics of the hysteresis comparator 100 are shown in FIG. 6, and the description of the specific process will not be repeated.

In the hysteresis comparator 100 shown in FIG. 8, the grid of the first input transistor (NMOS transistor N3) is selected to be connected with one of the first voltage VIN and the off voltage through the first switches S1 and S2, and the grid of the fourth input transistor (NMOS transistor N4) is selected to be connected with one of the second voltage Vref and the off voltage through the third switches S3 and S4.

Figure 12:
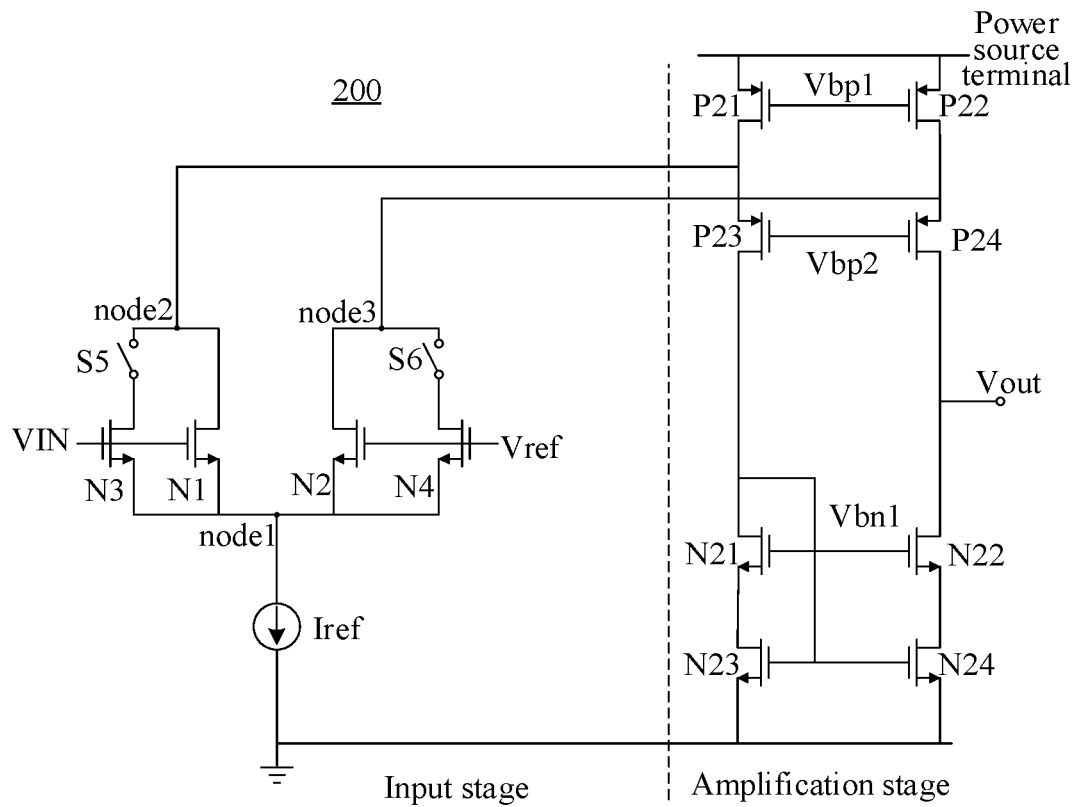
FIG. 12 shows a circuit diagram of another hysteresis comparator in an embodiment of the present disclosure.

FIG. 12 shows a circuit diagram of another hysteresis comparator 200 in an embodiment of the present disclosure. In the hysteresis comparator 200 shown in FIG. 12, a grid of a first input transistor (NMOS transistor N3) receives a first voltage VIN, a grid of a fourth input transistor (NMOS transistor N4) receives a second voltage Vref, the first input transistor (NMOS transistor N3) is selected through a fifth switch S5 to be connected in parallel to a second input transistor (NMOS transistor N1) in a first input branch or to be disconnected from the second input transistor (NMOS transistor N1), and the fourth input transistor (NMOS transistor N4) is selected through a sixth switch S6 to be connected in parallel to a third input transistor (NMOS transistor N2) in a second input branch or to be disconnected from the third input transistor (NMOS transistor N2). As shown in FIG. 12, the hysteresis comparator 200 includes: an input stage and an amplification stage. The amplification stage of the hysteresis comparator shown in FIG. 12 is the same as the amplification stage of the hysteresis comparator shown in FIG. 8. The input stage of the hysteresis comparator shown in FIG. 12 includes: a current source Iref, the first input branch, and the second input branch. One terminal of the current source Iref is connected to a node node1, and the other terminal of the current source is grounded. The first input branch is arranged between the node node1 and a node node2. The second input branch is arranged between the node node1 and a node node3.

The first input branch includes a first input sub-branch and a second input sub-branch. The first input sub-branch includes a second input transistor (NMOS transistor N1), a drain of the second input transistor (NMOS transistor N1) is connected to the node node2, a source of the second input transistor (NMOS transistor N1) is connected to the node node1, and a grid of the second input transistor (NMOS transistor N1) receives the first voltage VIN. The second input sub-branch includes the first input transistor (NMOS transistor N3) and the fifth switch S5 connected in series between the node node1 and the node node2. The grid of the first input transistor (NMOS transistor N3) receives the first voltage VIN. One terminal of the fifth switch S5 is connected to the node node2, and the other terminal of the fifth switch is connected to the first input transistor (NMOS transistor N3). In some other embodiments, one terminal of the fifth switch S5 is connected to the node node1, and the other terminal of the fifth switch is connected to the first input transistor (NMOS transistor N3). Switch-on and switch-off of the fifth switch S5 are controlled based on a first selection signal n_hys. When the first selection signal n_hys is a high level, and the fifth switch S5 is switched on, the first input sub-branch is connected in parallel to the second input sub-branch, and a current In of the first input branch is equal to a current of the second input transistor (NMOS transistor N1) plus a current of the third input transistor (NMOS transistor N2). When the first selection signal n_hys is a low level, and the fifth switch S5 is switched off, the first input sub-branch is disconnected from the second input sub-branch, and the current In of the first input branch is equal to the current of the second input transistor (NMOS transistor N1). Based on the first selection signal n_hys, the number of input sub-branches connected in the first input branch is adjusted, and the current In of the first input branch is adjusted.

The second input branch includes a third input sub-branch and a fourth input sub-branch. The third input sub-branch includes the third input transistor (NMOS transistor N2), a drain of the third input transistor (NMOS transistor N2) is connected to the node node3, a source of the third input transistor (NMOS transistor N2) is connected to the node node1, and a grid of the third input transistor (NMOS transistor N2) receives the second voltage Vref. The fourth input sub-branch includes the fourth input transistor (NMOS transistor N4) and the sixth switch S6 connected in series between the node node1 and the node node3. A grid of the fourth input transistor (NMOS transistor N4) receives the second voltage Vref. One terminal of the sixth switch S6 is connected to the node node3, and the other terminal of the sixth switch is connected to the fourth input transistor (NMOS transistor N4). In some other embodiments, one terminal of the sixth switch S6 is connected to the node node1, and the other terminal of the sixth switch is connected to the fourth input transistor (NMOS transistor N4). Switch-on and switch-off of the sixth switch S6 are controlled based on a second selection signal p_hys. When the second selection signal p_hys is a high level, and the sixth switch S6 is switched on, the third input sub-branch is connected in parallel to the fourth input sub-branch, and a current Ip of the second input branch is equal to the current of the third input transistor (NMOS transistor N2) plus a current of the fourth input transistor (NMOS transistor N4). When the second selection signal p_hys is a low level, and the sixth switch S6 is switched off, the third input sub-branch is disconnected from the fourth input sub-branch, and the current Ip of the second input branch is equal to the current of the third input transistor (NMOS transistor N2). Based on the second selection signal p_hys, the number of input sub-branches connected in the second input branch is adjusted, and the current Ip of the second input branch is adjusted.

When the first selection signal n_hys is 1, the fifth switch S5 is switched on; and when the second selection signal p_hys is 1, the sixth switch S6 is switched on. The first selection signal n_hys and the second selection signal p_hys are generated in the circuit shown in FIG. 9. The working process of the hysteresis comparator shown in FIG. 12 is the same as the working process of the hysteresis comparator shown in FIG. 8. The description will not be repeated here.

In some embodiments, the second input branch has a constant effective width-to-length ratio. and the effective width-to-length ratio of the first input branch may be changed to achieve a hysteresis comparator that only provides a negative hysteresis window. In some embodiments, the first input branch has a constant effective width-to-length ratio, and the effective width-to-length ratio of the second input branch may be changed to achieve a hysteresis comparator that only provides a positive hysteresis window.

Figure 13:
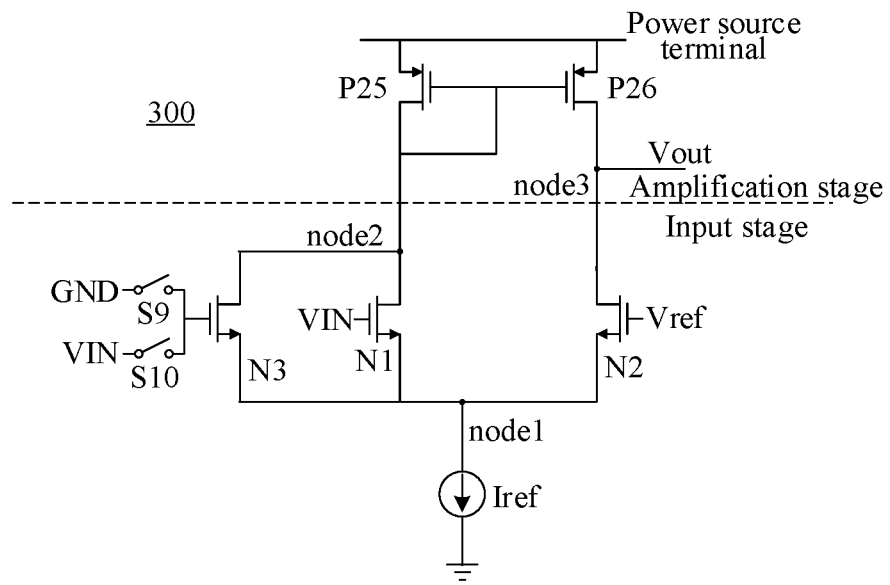
FIG. 13 shows a circuit diagram of another hysteresis comparator in an embodiment of the present disclosure.

FIG. 13 shows a circuit diagram of another hysteresis comparator in an embodiment of the present disclosure. The hysteresis comparator shown in FIG. 13 is based on the operational amplifier shown in FIG. 3. The hysteresis comparator 300 shown in FIG. 13 includes: an input stage and an amplification stage.

The input stage includes: a current source Iref, a first input branch, and a second input branch. One terminal of the current source Iref is connected to a node node1, and the other terminal of the current source is grounded. The first input branch is arranged between the node node1 and a node node2. The second input branch is arranged between the node node1 and a node node3. The second input branch includes: a third input transistor (NMOS transistor N2), a grid of the third input transistor (NMOS transistor N2) receives a second voltage Vref, and a current generated in the third input transistor (NMOS transistor N2) depends on the second voltage Vref. A current of the second input branch is equal to the current generated in the third input transistor (NMOS transistor N2). The first input branch includes: a first input sub-branch and a second input sub-branch. The first input sub-branch includes a second input transistor (NMOS transistor N1), a grid of the second input transistor (NMOS transistor N1) receives a first voltage VIN, a drain of the second input transistor is connected to the node node2, and a source of the second input transistor is connected to the node node1. The second input sub-branch includes a first input transistor (NMOS transistor N3). A drain of the first input transistor (NMOS transistor N3) is connected to the node node2. A source of the first input transistor is connected to the node node1. A grid of the first input transistor (NMOS transistor N3) is connected with an off voltage through a switch S9, and is connected with the first voltage VIN through a first switch S10. Switch-on or switch-off of the switches S9 and S10 is controlled based on a first selection signal n_hys.

The amplification stage includes PMOS transistors P25 and P26. The PMOS transistors P25 and P26 form a current mirror. A grid and a drain of the PMOS transistor P25 and a grid of the PMOS transistor P26 are connected to the node node2. A drain of the PMOS transistors P26 is connected to a node node3, and the node node3 serves as an output terminal of the hysteresis comparator 300. The hysteresis comparator 300 in FIG. 13 can provide a negative hysteresis window, and may be used in an application scenario where only the negative hysteresis window is required, i.e., M is equal to 1. Compared with the hysteresis comparator shown in FIG. 8 and FIG. 12, the number of transistors is saved, thus saving the layout area.

Figure 14:
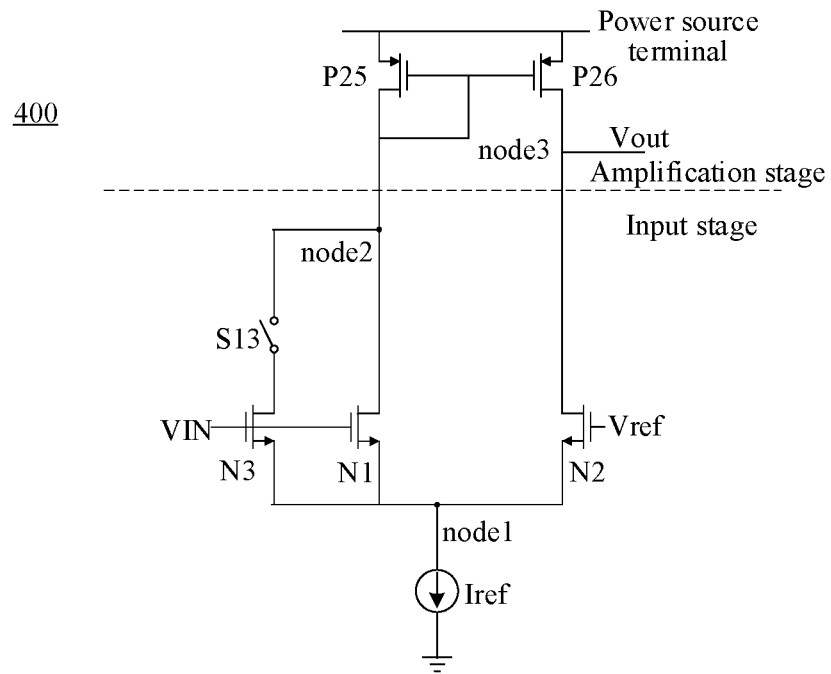
FIG. 14 shows a circuit diagram of another hysteresis comparator in an embodiment of the present disclosure.

FIG. 14 shows a circuit diagram of another hysteresis comparator in an embodiment of the present disclosure. The hysteresis comparator shown in FIG. 14 is based on the operational amplifier shown in FIG. 3. The hysteresis comparator 400 shown in FIG. 14 includes: an input stage and an amplification stage.

The input stage includes: a current source Iref, a first input branch, and a second input branch. One terminal of the current source Iref is connected to a node node1, and the other terminal of the current source is grounded. The first input branch is arranged between the node node1 and a node node2. The second input branch is arranged between the node node1 and a node node3. The second input branch includes a third input transistor (NMOS transistor N2), a grid of the third input transistor (NMOS transistor N2) receives a second voltage Vref, and a current generated in the third input transistor (NMOS transistor N2) depends on the second voltage Vref. A current of the second input branch is equal to the current generated in the third input transistor (NMOS transistor N2). The first input branch includes: a first input sub-branch and a second input sub-branch. The first input sub-branch includes a second input transistor (NMOS transistor N1), a grid of the second input transistor (NMOS transistor N1) receives a first voltage VIN, a drain of the second input transistor is connected to the node node2, and a source of the second input transistor is connected to the node node1. The second input sub-branch includes a first input transistor (NMOS transistor N3) and a first switch S13. A drain of the first input transistor (NMOS transistor N3) is connected to the node node2 through the first switch S13, a source of the first input transistor is connected to the node node1, and a grid of the first input transistor (NMOS transistor N3) receives the first voltage VIN. Switch-on or switch-off of the first switch S13 is controlled based on a first selection signal n_hys.

The amplification stage includes PMOS transistors P25 and P26. The PMOS transistors P25 and P26 form a current mirror. A grid and a drain of the PMOS transistor P25 and a grid of the PMOS transistor P26 are connected to the node node2. A drain of the PMOS transistors P26 is connected to a node node3, and the node node3 serves as an output terminal of the hysteresis comparator 400. The hysteresis comparator 400 in FIG. 14 can provide a negative hysteresis window, and may be used in an application scenario where only the negative hysteresis window is required, i.e., N is equal to 1. Compared with the hysteresis comparator shown in FIG. 8 and FIG. 12, the number of transistors is saved, thus saving the layout area.

Figure 15:
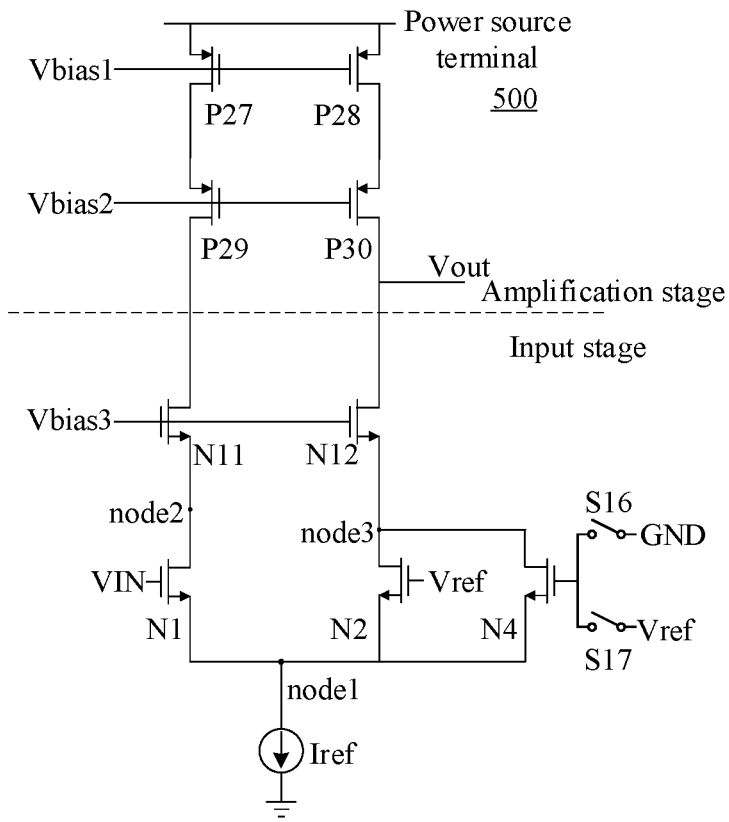
FIG. 15 shows a circuit diagram of another hysteresis comparator in an embodiment of the present disclosure.

FIG. 15 shows a circuit diagram of another hysteresis comparator in an embodiment of the present disclosure. The hysteresis comparator shown in FIG. 14 is based on a cascode operational amplifier. The hysteresis comparator 500 includes an input stage and an output stage. The input stage includes: a current source Iref, a first input branch, and a second input branch. One terminal of the current source Iref is connected to a node node1, and the other terminal of the current source is grounded. The first input branch is arranged between the node node1 and a node node2. The second input branch is arranged between the node node1 and a node node3. The first input branch includes a second input transistor (NMOS transistor N1), a source of the second input transistor (NMOS transistor N1) is connected to the node node1, a drain of the second input transistor is connected to the node node2, a grid of the second input transistor (NMOS transistor N1) is connected with a first voltage VIN, and the second input transistor (NMOS transistor N1) generates a current based on the first voltage VIN. A current of the first input branch is equal to the current of the second input transistor (NMOS transistor N1). The second input branch includes: a third input sub-branch and a fourth input sub-branch. The third input sub-branch includes a third input transistor (NMOS transistor N2), and the fourth input sub-branch includes a fourth input transistor (NMOS transistor N4). A source of the third input transistor (NMOS transistor N2) is connected to the node node1, a drain of the third input transistor is connected to the node node3, and a grid of the third input transistor receives a second voltage Vref. A source of the fourth input transistor (NMOS transistor N4) is connected to the node node1, and a drain of the fourth input transistor is connected to the node node3. A grid of the fourth input transistor (NMOS transistor N4) is connected with an off voltage through a first switch S16, and is connected with a second voltage Vref through a first switch S17. Switch-on or switch-off of the first switches S16 and S17 is controlled based on a second selection signal n_hys.

The input stage further includes: an NMOS transistor N11 and an NMOS transistor N12. The NMOS transistor N11 is connected to the node node2, and the NMOS transistor N12 is connected to the node node3. A grid of the NMOS transistor N11 and a grid of the NMOS transistor N12 receive a bias voltage Vbias3.

The amplification stage includes PMOS transistors P27-P30. The PMOS transistor P27, the PMOS transistor P29, and the NMOS transistor N11 are connected in series between a power source terminal and the node node2. The PMOS transistor P28, the PMOS transistor P30, and the NMOS transistor N12 are connected in series between the power source terminal and the node node3. A grid of the PMOS transistor P27 and a grid of the PMOS transistor P28 receive a bias voltage Vbias1, and a grid of the PMOS transistor P28 and a grid of the PMOS transistor P30 receive a bias voltage Vbias2. A drain of the PMOS transistors P30 is connected to a drain of the NMOS transistor N12, for use as an output terminal of the hysteresis comparator 500.

The hysteresis comparator 500 in FIG. 15 can provide a positive hysteresis window, and may be used in an application scenario where only the positive hysteresis window is required. Compared with the hysteresis comparator shown in FIG. 8 and FIG. 12, the number of transistors is saved, thus saving the layout area.

Figure 16:
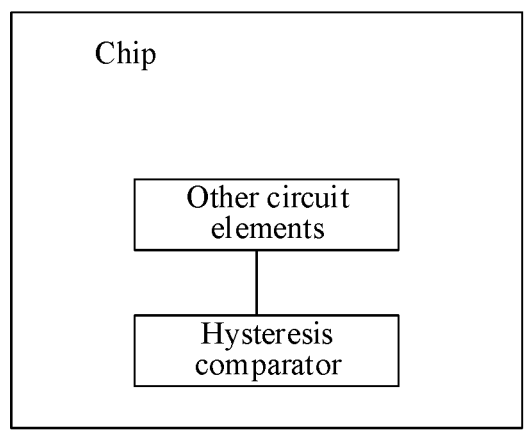
FIG. 16 shows a schematic block diagram of a chip in an embodiment of the present disclosure.

Referring to FIG. 16, the present disclosure further provides a chip, including the hysteresis comparator in the above embodiments and other circuit elements connected to the hysteresis comparator, to achieve circuit functions corresponding to the other circuit elements.

It should be noted that, in the description of the present disclosure, the terms "first" and "second" are only used for ease of description of different components or names, and cannot be understood as indicating or implying sequential relationship and relative importance or implicitly indicating the number of indicated technical features. Thus, features defined with "first" or "second" may explicitly or implicitly include at least one of the features.

Unless otherwise defined, all technical terms and scientific terms used herein have the same meaning as commonly understood by those skilled in the technical field of the present disclosure. The terms used herein in the description of the present disclosure are only for the purpose of describing specific embodiments, and are not intended to limit the present disclosure.

It should be noted that, the specific embodiments of the present disclosure are described in detail with reference to the drawings, but should not be understood as imposing any limitation on the scope of protection of the present disclosure. Within the scope described in the claims, various alterations and modifications that can be made by those skilled in the art without making creative work are still encompassed within the scope of protection of the present disclosure.

The examples of the embodiments of the present disclosure are intended to simply illustrate the technical features of the embodiments of the present disclosure, so that those skilled in the art can intuitively understand the technical features of the embodiments of the present disclosure, which are not used to impose any improper limitation on the embodiments of the present disclosure.

Finally, it should be noted that: the above embodiments are merely used to illustrate the technical solutions of the present disclosure, instead of imposing any limitation on the present disclosure. Although the present disclosure has been described in detail with reference to the above embodiments, those with ordinary skills in the art should understand that: the technical solutions disclosed in the above embodiments may still be modified or a part of the technical features thereof may be replaced equivalently. These modifications or replacements are not intended to make the essence of corresponding technical solutions depart from the spirit and scope of the technical solutions of the embodiments of the present disclosure.

What is claimed is:

1. An operational amplifier-based hysteresis comparator, configured to compare a first voltage with a second voltage, the hysteresis comparator comprising: an input stage and an amplification stage connected with the input stage, wherein
   the input stage comprises: a first input branch and a second input branch, wherein the first input branch generates a first current based on the first voltage, and the second input branch generates a second current based on the second voltage,
   the first input branch comprises N number of connected input sub-branches, N is determined based on a first selection signal, and when N is greater than or equal to 2, N input sub-branches are connected in parallel,
   the second input branch comprises M number of connected input sub-branches, M is determined based on a second selection signal, and when M is greater than or equal to 2, M input sub-branches are connected in parallel,
   M and N are positive integers, and at least one of M and N is greater than or equal to 2, and
   the amplification stage comprises: a first input terminal, a second input terminal, and an output terminal, the first current is connected with the first input terminal, the second current is connected with the second input terminal, the output terminal outputs a first level when the first current is greater than the second current, the output terminal outputs a second level when the first current is less than the second current, the first level is a high level, and the second level is a low level;
   wherein when N is a positive integer greater than 2, and the first input branch comprises N−1 number of first input sub-branches and one second input sub-branch, a width-to-length ratio of each first input transistor in the N−1 number of first input sub-branches is different; and
   when M is a positive integer greater than 2, and the second input branch comprises M−1 number of fourth input sub-branches and one third input sub-branch, a width-to-length ratio of each fourth input transistor in the M−1 number of fourth input sub-branches is different.

2. The hysteresis comparator according to claim 1, wherein, when N is a positive integer greater than or equal to 2, the hysteresis comparator provides a negative hysteresis window; or when M is a positive integer greater than or equal to 2, the hysteresis comparator provides a positive hysteresis window.

3. The hysteresis comparator according to claim 2, wherein, when N is a positive integer greater than or equal to 2, the first input branch comprises: a first input sub-branch and a second input sub-branch, the first input sub-branch comprises a first input transistor, a grid of the first input transistor is selected to, based on the first selection signal, receive one of the first voltage and an off voltage, the first input sub-branch is connected in parallel to the second input sub-branch when the grid of the first input transistor receives the first voltage, the first input sub-branch is disconnected from the second input sub-branch when the grid of the first input transistor receives the off voltage, the second input sub-branch comprises a second input transistor, and a grid of the second input transistor receives the first voltage;

when N is equal to 1, the first input branch comprises: a second input sub-branch, the second input sub-branch comprises the second input transistor, and the grid of the second input transistor receives the first voltage;

when M is a positive integer greater than or equal to 2, the second input branch comprises: a third input sub-branch and a fourth input sub-branch, the fourth input sub-branch comprises a fourth input transistor, a grid of the fourth input transistor is selected to, based on the second selection signal, receive one of the second voltage and the off voltage, the fourth input sub-branch is connected in parallel to the third input sub-branch when the grid of the fourth input transistor receives the second voltage, the fourth input sub-branch is disconnected from the third input sub-branch when the grid of the fourth input transistor receives the off voltage, the third input sub-branch comprises a third input transistor, and a grid of the third input transistor receives the second voltage; and when M is equal to 1, the second input branch comprises: the third input sub-branch, the third input sub-branch comprises the third input transistor, and the grid of the third input transistor receives the second voltage.

4. The hysteresis comparator according to claim 3, wherein the grid of the first input transistor is connected with the off voltage through a first switch, and is connected with the first voltage through a second switch; when the first selection signal is a high level, the first switch is switched off, the second switch is switched on, and the grid of the first input transistor receives the first voltage; and when the first selection signal is a low level, the first switch is switched on, the second switch is switched off, and the grid of the first input transistor receives the off voltage; and the grid of the fourth input transistor is connected with the off voltage through a third switch, and is connected with the second voltage through a fourth switch; when the second selection signal is a high level, the third switch is switched off, the fourth switch is switched on, and the grid of the fourth input transistor receives the second voltage; and when the second selection signal is a low level, the third switch is switched on, the fourth switch is switched off, and the grid of the fourth input transistor receives the off voltage.

5. The hysteresis comparator according to claim 4, wherein a transmission gate is used for the second switch and the fourth switch.

6. The hysteresis comparator according to claim 5, wherein the transmission gate comprises a PMOS transistor and an NMOS transistor in parallel, a drain of the PMOS transistor and a drain of the NMOS transistor receive the first voltage or the second voltage in parallel, a source of the PMOS transistor and a source of the NMOS transistor are connected in parallel to the grid of the first input transistor or the grid of the fourth input transistor, a grid of the NMOS transistor receives the first selection signal, and a grid of the PMOS transistor receives an inversion signal of the first selection signal.

7. The hysteresis comparator according to claim 2, wherein, when N is a positive integer greater than or equal to 2, the first input branch comprises: a first input sub-branch and a second input sub-branch, the first input sub-branch comprises a first input transistor, a grid of the first input transistor receives the first voltage, a drain of the first input transistor receives the first selection signal, the first selection signal controls the first input sub-branch to be connected in parallel to or to be disconnected from the second input sub-branch, the second input sub-branch comprises a second input transistor, and a grid of the second input transistor receives the first voltage;

when N is equal to 1, the first input branch comprises: the second input sub-branch, the second input sub-branch comprises the second input transistor, and the grid of the second input transistor receives the first voltage;

when M is a positive integer greater than or equal to 2, the second input branch comprises: a third input sub-branch and a fourth input sub-branch, the fourth input sub-branch comprises a fourth input transistor, a grid of the fourth input transistor receives the second voltage, a drain of the fourth input transistor receives the second selection signal, the second selection signal controls the fourth input sub-branch to be connected in parallel to or to be disconnected from the third input sub-branch, the third input sub-branch comprises a third input transistor, and a grid of the third input transistor receives the second voltage; and when M is equal to 1, the second input branch comprises: the third input sub-branch, the third input sub-branch comprises the third input transistor, and the grid of the third input transistor receives the second voltage.

8. The hysteresis comparator according to claim 7, wherein the drain of the first input transistor receives the first selection signal through a fifth switch; when the first selection signal is a high level, the fifth switch is switched on, and the first input sub-branch is connected in parallel to the second input sub-branch; and when the first selection signal is a low level, the fifth switch is switched off, and the first input sub-branch is disconnected from the second input sub-branch; and the drain of the fourth input transistor receives the second selection signal through a sixth switch; when the second selection signal is a high level, the sixth switch is switched on, and the fourth input sub-branch is connected in parallel to the third input sub-branch; and when the second selection signal is a low level, the sixth switch is switched off, and the fourth input sub-branch is disconnected from the third input sub-branch.

9. The hysteresis comparator according to claim 2, wherein the hysteresis comparator receives a first enable signal and a second enable signal, the first enable signal is used to enable the negative hysteresis window, the second enable signal is used to enable the positive hysteresis window, the first selection signal is determined based on the first enable signal and an output level of the hysteresis comparator, and the second selection signal is determined based on the second enable signal and the output level of the hysteresis comparator.

10. The hysteresis comparator according to claim 9, wherein when the first enable signal enables the negative hysteresis window and the output level of the hysteresis comparator is a low level, the first selection signal is a low level; or when the first enable signal enables the negative hysteresis window and the output level of the hysteresis comparator is a high level, the first selection signal is a high level; and when the second enable signal enables the positive hysteresis window, and the output level of the hysteresis comparator is a low level, the second selection signal is a high level; or when the second enable signal enables the positive hysteresis window and the output level of the hysteresis comparator is a high level, the second selection signal is a low level.

11. The hysteresis comparator according to claim 2, wherein when the first input branch comprises a plurality of input sub-branches, a width-to-length ratio of a first input transistor of each input sub-branch of the first input branch is different, and/or, when the second input branch comprises a plurality of input sub-branches, a width-to-length ratio of a second input transistor of each input sub-branch of the second input branch is different.

12. The hysteresis comparator according to claim 1, wherein the hysteresis comparator further comprises a Schmidt trigger, and an input terminal of the Schmidt trigger is connected to the output terminal of the amplification stage.

13. The hysteresis comparator according to claim 12, wherein, an output voltage of the hysteresis comparator is supplied as a feedback signal to a generation circuit of the first selection signal and the second selection signal, and the Schmidt trigger is provided at the output terminal of the amplification stage; and
an output terminal of the Schmidt trigger serves as the output terminal of the hysteresis comparator.

14. The hysteresis comparator according to claim 1, wherein, the width-to-length ratio of each first input transistor in the N−1 number of the first input sub-branches is increasing or decreasing; and
the width-to-length ratio of each fourth input transistor in the M−1 number of the fourth input sub-branches is increasing or decreasing.

15. The hysteresis comparator according to claim 1, wherein, the first input branch comprises a first input sub-branch and a second input sub-branch, the first input sub-branch comprises a second input transistor, a grid of the second input transistor receives the first voltage, and the second input sub-branch comprises a first input transistor and a fifth switch, a grid of the first input transistor receives the first voltage, when the first selection signal is the high level and the fifth switch is switched on, the first input sub-branch is connected in parallel to the second input sub-branch; when the first selection signal is the low level and the fifth switch is switched off, the first input sub-branch is disconnected from the second input sub-branch; and
the second input branch comprises a third input sub-branch and a fourth input sub-branch, the third input sub-branch comprises a third input transistor, a grid of the third input transistor receives the second voltage, and the fourth input sub-branch comprises a fourth input transistor and a sixth switch, a grid of the fourth input transistor receives the second voltage, when the second selection signal is the high level and the sixth switch is switched on, the third input sub-branch is connected in parallel to the fourth input sub-branch; when the second selection signal is the low level and the sixth switch is switched off, the third input sub-branch is disconnected from the fourth input sub-branch.

16. The hysteresis comparator according to claim 2, wherein, the hysteresis comparator has three hysteresis modes comprising a first hysteresis mode, a second hysteresis mode, and a third hysteresis mode, a first enable signal and a second enable signal are used for setting the hysteresis modes of the hysteresis comparator; wherein
in the first hysteresis mode, the hysteresis comparator has the positive hysteresis window and the negative hysteresis window; in the second hysteresis mode, the hysteresis comparator has the negative hysteresis window; and in the third hysteresis mode, the hysteresis comparator has the positive hysteresis window.

17. The hysteresis comparator according to claim 16, wherein,
the first input branch has a constant effective width-to-length ratio, and the third hysteresis mode of the hysteresis comparator that has the positive hysteresis window is achieved by changing the effective width-to-length ratio of the second input branch; and
the second input branch has a constant effective width-to-length ratio, and the second hysteresis mode of the hysteresis comparator that has the negative hysteresis window is achieved by changing the effective width-to-length ratio of the first input branch.

18. The hysteresis comparator according to claim 3, wherein, the fourth input sub-branch comprises the fourth input transistor, a third switch and a fourth switch; wherein
a drain of the fourth input transistor is connected to a node connected with the amplification stage, a source of the fourth input transistor is connected to the node node1 of a current source, and the grid of the fourth input transistor is connected to a first terminal of the third switch and a first terminal of the fourth switch; and
a second terminal of the third switch is connected to a terminal providing the off voltage; a second terminal of the fourth switch is connected to a terminal providing the second voltage; wherein, switch-on and switch-off of the third switch and the fourth switch are controlled based on the second selection signal.

19. A chip, comprising an operational amplifier-based hysteresis comparator, the hysteresis comparator being configured to compare a first voltage with a second voltage and comprising: an input stage and an amplification stage connected with the input stage, wherein
the input stage comprises: a first input branch and a second input branch, wherein the first input branch generates a first current based on the first voltage, and the second input branch generates a second current based on the second voltage,
the first input branch comprises N number of connected input sub-branches, N is determined based on a first selection signal, and when N is greater than or equal to 2, N input sub-branches are connected in parallel,
the second input branch comprises M number of connected input sub-branches, M is determined based on a second selection signal, and when M is greater than or equal to 2, M input sub-branches are connected in parallel,
M and N are positive integers, and at least one of M and N is greater than or equal to 2, and
the amplification stage comprises: a first input terminal, a second input terminal, and an output terminal, the first current is connected with the first input terminal, the second current is connected with the second input terminal, the output terminal outputs a first level when the first current is greater than the second current, the output terminal outputs a second level when the first current is less than the second current, the first level is a high level, and the second level is a low level;
wherein when N is a positive integer greater than 2, and the first input branch comprises N−1 number of first input sub-branches and one second input sub-branch, a width-to-length ratio of each first input transistor in the N−1 number of first input sub-branches is different; and
when M is a positive integer greater than 2, and the second input branch comprises M−1 number of fourth input sub-branches and one third input sub-branch, a widthto-length ratio of each fourth input transistor in the M−1 number of fourth input sub-branches is different.

* * * * *